United States Patent
Wu

(10) Patent No.: US 8,010,914 B2
(45) Date of Patent: Aug. 30, 2011

(54) CIRCUIT STRUCTURE OF INTEGRATED CIRCUIT

(75) Inventor: Chao-Chueh Wu, Hsinchu County (TW)

(73) Assignee: Inotera Memories, Inc., Taoyuan (TW)

( * ) Notice: Subject to any disclaimer, the term of this patent is extended or adjusted under 35 U.S.C. 154(b) by 488 days.

(21) Appl. No.: 11/939,560

(22) Filed: Nov. 14, 2007

(65) Prior Publication Data

US 2009/0125853 A1    May 14, 2009

(51) Int. Cl.
*G06F 17/50* (2006.01)

(52) U.S. Cl. ............ 716/51; 716/56; 716/111; 716/112; 716/119; 716/136

(58) Field of Classification Search ............ 716/51, 716/56, 110–112, 119, 136
See application file for complete search history.

(56) References Cited

U.S. PATENT DOCUMENTS

| | | | |
|---|---|---|---|
| 6,368,761 B1 * | 4/2002 | Chien et al. | 430/22 |
| 6,629,304 B1 * | 9/2003 | Gasanov et al. | 716/10 |
| 6,876,040 B1 * | 4/2005 | Wann et al. | 257/351 |
| 2002/0095617 A1 * | 7/2002 | Norman | 714/10 |
| 2004/0015735 A1 * | 1/2004 | Norman | 714/10 |
| 2004/0064800 A1 * | 4/2004 | Korobkov | 716/10 |
| 2005/0089467 A1 * | 4/2005 | Grill et al. | 423/447.3 |
| 2005/0229142 A1 * | 10/2005 | Boppana et al. | 716/17 |
| 2006/0117293 A1 * | 6/2006 | Smith et al. | 716/19 |

* cited by examiner

*Primary Examiner* — Paul Dinh
(74) *Attorney, Agent, or Firm* — Jianq Chyun IP Office

(57) ABSTRACT

A circuit structure of an integrated circuit is provided. The circuit structure is adapted for a circuit layout of a wafer. The circuit structure at least includes a first array cell and a second array cell. The second array cell and the first array cell are connected to each other and have a connecting area, wherein the second array cell is shifted a distance along the connecting area. Therefore, the result of yield enhancement is achieved.

11 Claims, 3 Drawing Sheets

CIRCUIT STRUCTURE OF INTEGRATED CIRCUIT

BACKGROUND OF THE INVENTION

1. Field of the Invention

The present invention relates to an integrated circuit. More particularly, the present invention relates to a circuit structure of an integrated circuit.

2. Description of Related Art

With the blooming development of integrated circuit (IC) industry, miniaturization and integration of components are an inevitable trend, and have become important issues that different researchers focus on. Therefore, during manufacturing of the ICs or chips, electrical testing of the ICs or the chips at each processing stage is indispensable.

During fabrication of the ICs, processing conditions of the ICs are required to be adjusted to determine optimized processing parameters or component parameters, so as to improve a production yield of the ICs. Therefore, during the design of experiment (DOE) of research and development or manufacturing, a single wafer is required to be applied to each data point in an experiment. If a plurality of different parameters is required in the experiment, a number of wafers equivalent to that of the different parameters is required. However, the cost of the wafers (especially large-diameter wafers) is expensive when the processing parameters and the component parameters are optimized. Therefore, performing the aforementioned DOE on wafers will cost a lot of time and money.

Moreover, during the fabrication of the semiconductors, there are many factors which may influence the production yield. Therefore, during designing of the circuit, testing points or testing structure should be preset, according to the testing requirement of a finished product. When fabrication of the wafer is completed, wafer acceptance testing (WAT) based on a preset testing program is then performed, and problems that may occur during fabrication may be evaluated according to a testing result.

In a conventional technique, splitting test is generally performed on each lot of product, namely, a certain proportion of samples are selected from each lot of product, and testing is performed on the selected samples. Then, problems that may occur during fabrication will be evaluated according to the testing result, and the testing result is then statistically applied to all the products of the same lot.

However, if the splitting test is performed under poor lot conditions, the production yield may be reduced. Changing of a baseline during fabrication may cause a shifting of a process window, and therefore additional testing has to be performed. Moreover, the DOE and WAT are performed after the fabrication of the wafers is finished. Therefore, if abnormalities occurs during the fabrication, it cannot be solved immediately, and failure analysis or DOE of shifting can be performed only after the testing result is obtained. In this case, more testing time is required. Therefore, a quick and accurate testing method is highly desired.

SUMMARY OF THE INVENTION

The present invention is directed to a circuit structure of an integrated circuit, by which yields properties of product parameters can be quickly and effectively analyzed and fed back to a fabrication process for improvement, such that production yield can be quickly improved.

The present invention provides a process testing method of a chip. The circuit layout of the chip at least includes a first array cell and a second array cell. The process testing method may be described as follows. The second array cell is shifted to a predetermined distance apart from the first array cell. Next, electrical characteristics of the first array cell and the second array cell are compared for evaluating yield of the chip.

The present invention provides a process testing method of a wafer. The circuit layout of the wafer has a plurality of chips, and each chip has a plurality of array cells. The process testing method is as follows. At least a part of the array cells are shifted a preset distance. Then, electrical characteristics of each array cell before the shifting and after the shifting are compared for evaluating yield of the wafer.

The present invention provides a circuit structure of an integrated circuit, which is adapted for a circuit layout of a wafer. The circuit structure at least includes a first array cell and a second array cell. The second array cell and the first array cell are connected with each other and have a first connecting area there between, wherein the second array cell is shifted to a predetermined distance along the first connecting area.

In the present invention, by shifting the array cells of the circuit structure of an integrated circuit and comparing the electrical characteristics of each array cell before the shifting and after the shifting, the corresponding yield and relevance and tolerance of shifting factors of the process can be evaluated according to the comparing result, so as to obtain an optimized result of a processing target. Therefore, analysis of yield properties can be expedited, and the related process can be effectively adjusted, such that the production yield can be quickly improved.

In order to make the aforementioned and other objects, features and advantages of the present invention comprehensible, a preferred embodiment accompanied with figures is described in detail below.

DESCRIPTION OF EMBODIMENTS

Figure 1:
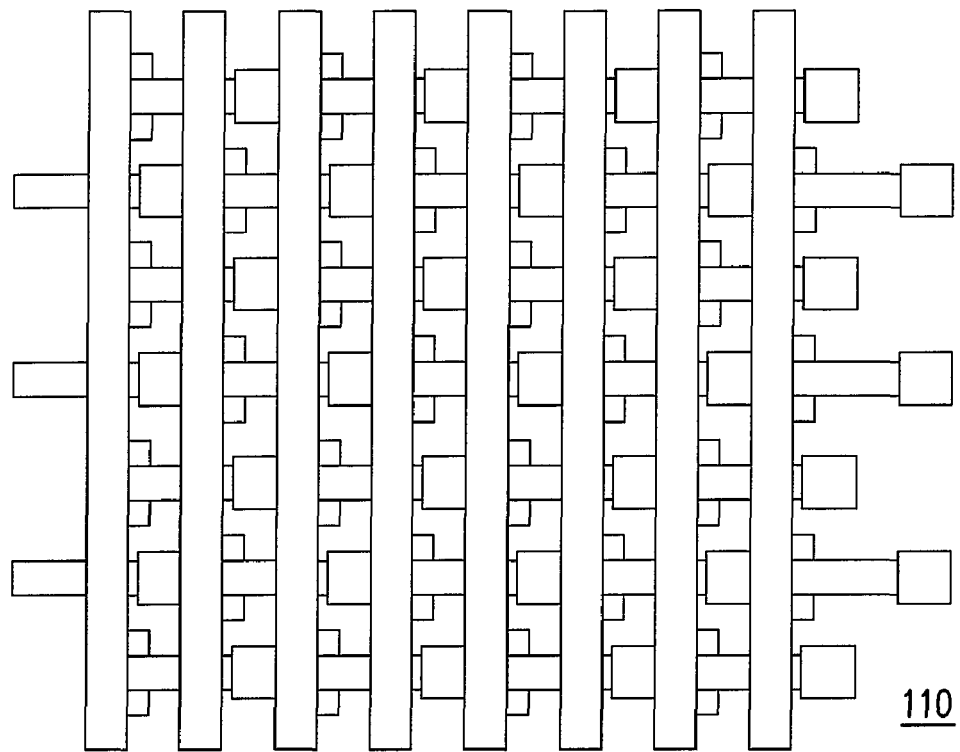
FIG. 1 is a layout diagram of a circuit structure of an integrated circuit according to an embodiment of the present invention.

In the following embodiments, a circuit structure of an integrated circuit is adapted for a circuit layout of a wafer, and the circuit layout of the wafer may be applied to a 90 nanometers (nm) process. However, application of the circuit layer is not limited thereon. The wafer has a plurality of chips, and each chip has a plurality of array cells. The array cells 110 are arranged in an array, shown as FIG. 1.

Figure 2:
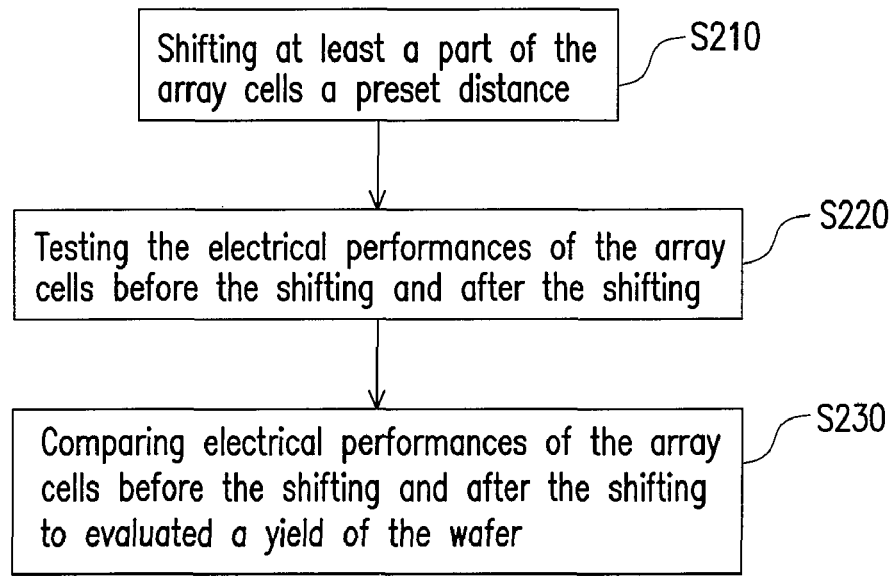
FIG. 2 is a flowchart of a process testing method of a wafer according to an embodiment of the present invention.
Figure 3:
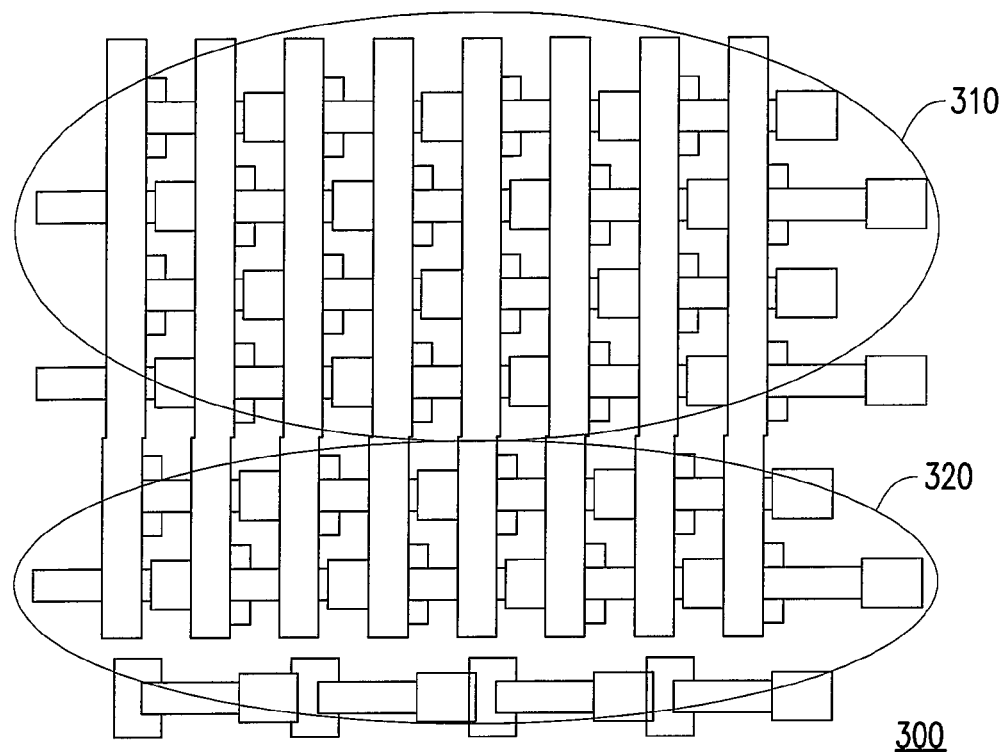
FIG. 3 is a layout diagram of a circuit structure of an integrated circuit according to another embodiment of the present invention.

FIG. 2 is a flowchart of a process testing method of a wafer according to an embodiment of the present invention. FIG. 3 is a layout diagram of a circuit structure of an integrated circuit according to the first embodiment of the present invention. Referring to FIG. 3, the circuit structure of an integrated circuit 300 includes a first array cell 310 and a second array cell 320. The first array cell 310 has a same structure with that of a standard integrated circuit shown in FIG. 1, and the second array cell 320 has a novel circuit structure according to the present invention. Referring to FIG. 2 and FIG. 3, the testing method may be described as follows. In the step S210, based on a design of a mask, at least a part of the array cells is shifted a predetermined distance, for example, 5 nm. According to FIG. 3, the first array cell 310 of the circuit structure 300 is the pre-shifted array cell shown in FIG. 1, and the second array cell 320 of the integrated circuit 300 is the shifted array cell shown in FIG. 1. The second array cell 320 is shifted the predetermined distance along a connecting area formed between the first array cell 310 and the second array cell 320.

In step S220, a testing program for testing electrical characteristics of the first array cell 310 and the second array cell 320 is performed to obtain the information on the electrical characteristics of the first array cell 310 and the second array cell 320. The testing program may be a wafer acceptance testing (WAT).

In step S230, the electrical characteristics of the first array cell 310 and the second array cell 320 are compared to evaluate affections to the production yield due to shifting of the array cell of the circuit structure 300. Original electrical characteristic of the second array cell 320 will be changed. If the first array cell 310 has a good electrical characteristic, and the second array cell 320 has a poor electrical characteristic, it means the shifting distance of the second array cell 320 is excessive, and therefore an related process can be adjusted or limited, such that shifting action of the second array cell 310 can be avoided in the standard circuit structure of the first array cell 310.

In other words, if the second array cell 320 has the good electrical characteristic, and the first array cell 310 has the poor electrical characteristic, it means a process window is lost, and therefore process conditions can be adjusted immediately according to the testing result, and failure analysis and DOE of the shifting need not be performed. Moreover, if the first array cell 310 and the second array cell 320 all have good electrical characteristics, it means the process window is relatively big in size, and limitation of the process then can be relaxed according to this testing result to reduce production efficiency losses due to rework. Therefore, after comparison of the electrical characteristics of the first array cell 310 and the second array cell 320, optimized target and limiting conditions of the process can be evaluated, and yield of the wafers can be improved quickly.

In the present embodiment, shifting phenomenon of a baseline need not be measured, since the shifted part of the array cells has been designed before the masking. The electrical characteristics of all the array cells may be obtained via the aforementioned testing process, and then yield of the wafers (circuit structure of the integrated circuit) can be evaluated by comparing the electrical characteristics. Therefore, lost of yield due to the DOE being performed under poor lot conditions can be avoided.

Figure 4:
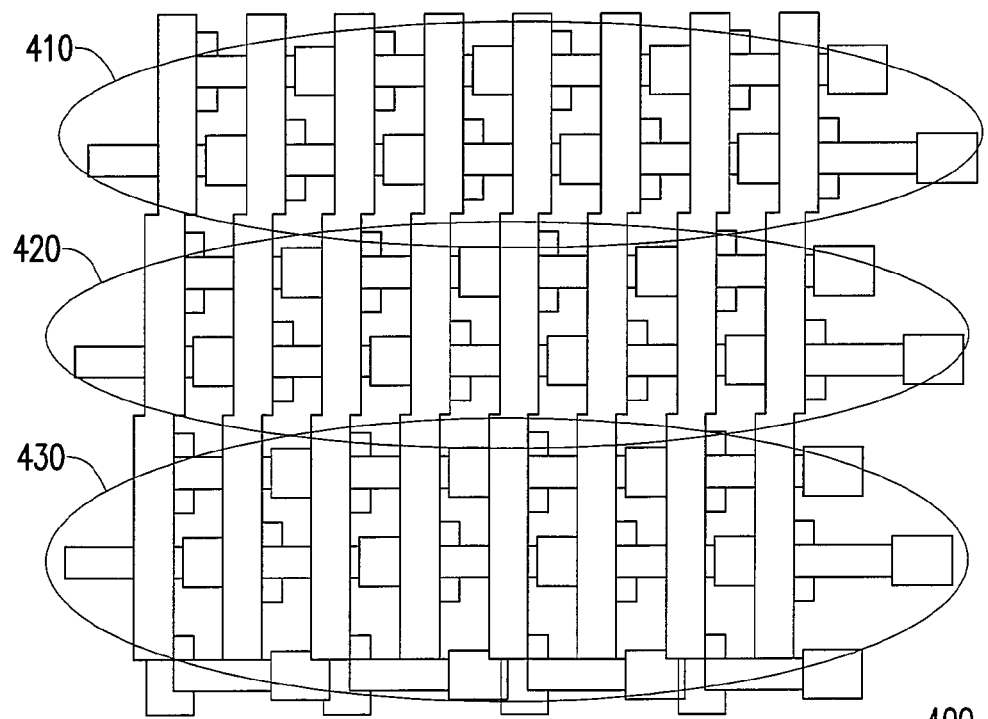
FIG. 4 is a layout diagram of a circuit structure of an integrated circuit according to still another embodiment of the present invention.

The aforementioned embodiment is one of the embodiments of the present invention, and another embodiment of the present invention will be set forth as follows. FIG. 4 is a layout diagram of a circuit structure of an integrated circuit according to an embodiment of the present invention. Referring to FIG. 4, the circuit structure 400 includes a first array cell 410, a second array cell 420 and a third array cell 430. Referring to FIG. 2 and FIG. 4, the testing method is described as follows. In step S210, based on the design of the mask, at least a part of the array cells is shifted to a predetermined distance. Namely, the second array cell 420 is shifted to the predetermined distance along the connecting area formed between the first array cell 410 and the second array cell 420, and the third array cell 430 is shifted to the predetermined distance along the connecting area formed between the second array cell 420 and the third array cell 430. The preset distance may be 5 nm. Next, in step S220, the testing program for testing electrical characteristics of the pre-shifted first array cell 410 and the shifted second array cell 420 and the third array cell 430 is performed.

In step S230, after the testing of the electrical characteristics is performed, the electrical characteristics of each array cell before the shifting and after the shifting are compared to evaluate the yield of the wafers. However, if the pre-shifted first array cell 410 has a good electrical characteristic, and the shifted second array cell 420 and the third array cell 430 also have a good electrical characteristic, it means that the process window is bigger than that of the aforementioned embodiment, and errors occurred during alignment of the process widow can be further reduced.

Figure 5:
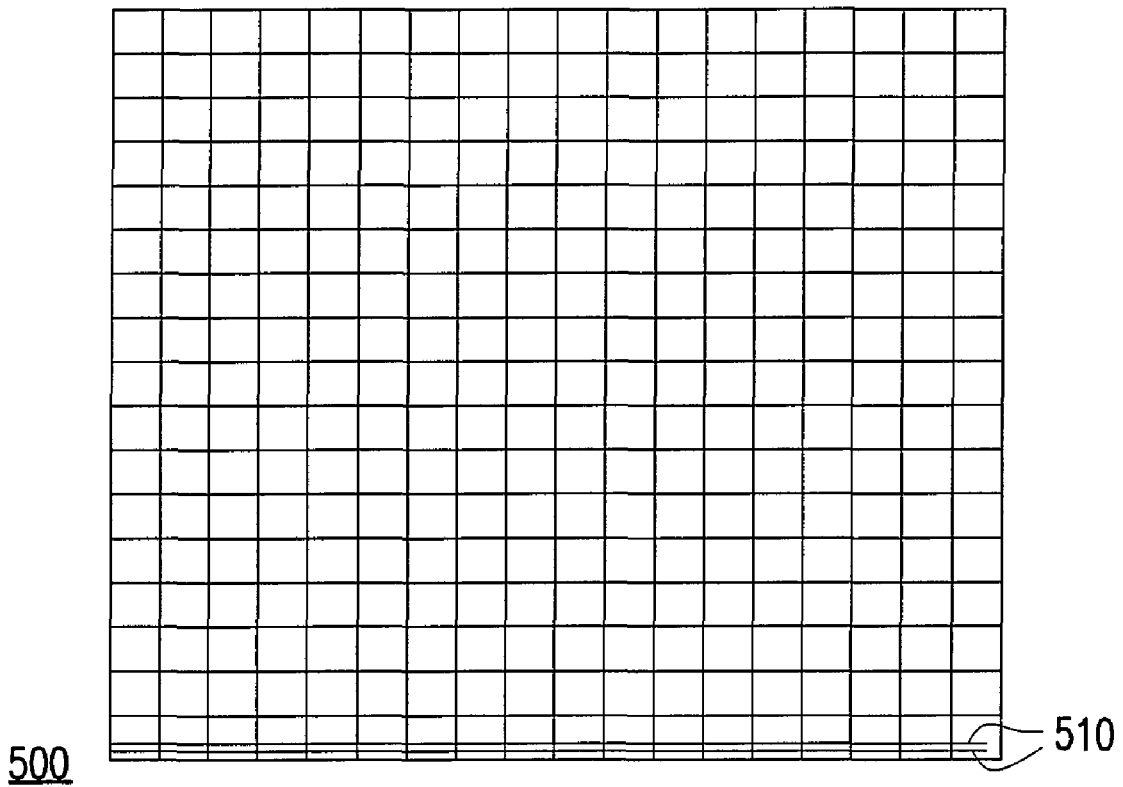
FIG. 5 is a schematic diagram illustrating an array matrix of chips according to an embodiment of the present invention.

In the above two embodiments, size of the chips are increased while array cells are shifted. Another example is provided to demonstrate whether the number of chips generated on the wafers are affected when the size of the chips are increased. The size of the chips of a 512M dynamic random access memory (DRAM) may be taken as an example, and the chips of the 512M DRAM are divided into a plurality of small blocks as shown in FIG. 5. FIG. 5 is a schematic diagram illustrating an array matrix of chips according to an embodiment of the present invention. Referring to FIG. 5, a pair of bit lines 510 is added to the array matrix 500 from the utmost side of the array matrix 500, and the length of the bit lines 510 is equivalent to the aforementioned predetermined distance of about 5 nm.

Referring to FIG. 5 again, the bit lines 510 cannot be added singly since bit lines should be added in pairs for induction. The total area of the wafer is increased 12.96 micrometer (μm) when the pair of the bit lines 510 is added. Since a width of a scribe line between chips is about 80~90 μm, increase of 12.96 μm in the chip size may have a negligible effect on the number of chips formed on the wafer.

In the present embodiment, as long as the increase in the chip size is not greater than the width of the scribe line between chips, a certain block of the chips then may be slightly moved towards different directions on the mask to obtain a different circuit. Therefore, different circuits can be designed, and diversified results can be provided based on the different circuits.

Moreover, the aforementioned method and the circuit structure of an integrated circuit may also be applied to a design of critical dimension (CD) of a photolithographic process. Namely, the shifted part of the CD is pre-designed before the photolithographic process. Then, if the deliberately adjusted circuit causes a lost of a testing yield, the target of the CD may be adjusted towards a direction where lost of the yield can be avoided. The above fine-tuning process can be performed without learning from a specially designed DOE or a massive loss of the yield.

In summary, in the present invention, array cells of the circuit structure of the integrated circuit can be shifted, wherein the shifted part is pre-designed before the masking, and therefore shifting phenomenon of the baseline need not be taken into consideration. The yield of the wafers can be evaluated by comparing the electrical characteristics of each array cell before the shifting and after the shifting. Therefore, testing of the wafers can be expedited, and the yield of the wafers can be effectively improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process testing method of a chip, a circuit layout of the chip at least having a first array cell, a second array cell, and a third array cell, the first array cell, the second array cell, and the third array cell are arranged in an axis, the method comprising:
    shifting the second array cell to a first predetermined distance along a connecting area formed between the first array cell and the second array cell;
    shifting the third array cell to a second predetermined distance along a connecting area formed between the second array cell and the third array cell, wherein the second predetermined distance is greater than the first predetermined distance; and
    comparing electrical characteristics of the first array cell, the second array cell and the third array cell to obtain a compared result for indicating a state of a process window and determining whether the first predetermined distance and second predetermined distance are adjusted, so as to evaluate a yield of the chip based on the compared result.

2. The process testing method of a chip as claimed in claim 1, wherein the step of comparing electrical characteristics of the first array cell, the second array cell and the third array cell further comprises testing the electrical characteristics of the first array cell, the second array cell and the third array cell.

3. The process testing method of a chip as claimed in claim 1, wherein the first predetermined distance is 5 nm.

4. The process testing method of a chip as claimed in claim 1, wherein the circuit layout of the chip is applied to a 90 nm process.

5. The process testing method of a chip as claimed in claim 1, wherein the circuit layout of the chip is applied to a critical dimension (CD) of a photolithographic process.

6. A process testing method of a wafer, a circuit layout of the wafer having a plurality of chips, and each chip having a first part of array cells, a second part of array cells and a third part of array cells arranged in an axis, the method comprising:
    shifting the second part of array cells to a first predetermined distance along connecting areas formed between the first part of array cells and the third part of the array cells;
    shifting the third part of array cells to a second predetermined distance along connecting areas formed between the second part of array cells and the third part of array cells, wherein the second predetermined distance is greater than the first predetermined distance; and
    comparing electrical characteristics of the first part of array cells, the second part of array cells and the third part of array cells to obtain a compared result for indicating a state of a process window and determining whether the first predetermined distance and second predetermined distance are adjusted, so as to evaluate a yield of the wafer based on the compared result.

7. The process testing method of a wafer as claimed in claim 6, wherein the step of comparing electrical characteristics of the first part of array cells, the second part of array cells and the third part of array cells comprises testing the electrical characteristics of the first part of array cells, the second part of array cells and the third part of array cells.

8. The process testing method of a wafer as claimed in claim 6, wherein the array cells are arranged in an array.

9. The process testing method of a wafer as claimed in claim 6, wherein the first predetermined distance is 5 nm.

10. The process testing method of a wafer as claimed in claim 6, wherein the circuit layout of the wafer is applied to a 90 nm process.

11. The process testing method of a wafer as claimed in claim 6, wherein the circuit layout of the wafer is applied to a CD of a photolithographic process.

* * * * *